(12) United States Patent
Rodov et al.

(10) Patent No.: US 6,979,861 B2
(45) Date of Patent: Dec. 27, 2005

(54) POWER DEVICE HAVING REDUCED REVERSE BIAS LEAKAGE CURRENT

(75) Inventors: Vladimir Rodov, Redondo Beach, CA (US); Paul Chang, Saratoga, CA (US); Gary M. Hurtz, Pleasanton, CA (US); Geeng-Chuan Chern, Cupertino, CA (US); Jianren Bao, Fullerton, CA (US)

(73) Assignee: APD Semiconductor, Inc., San Jose, CA (US)

(*) Notice: Subject to any disclaimer, the term of this patent is extended or adjusted under 35 U.S.C. 154(b) by 187 days.

(21) Appl. No.: 10/159,558

(22) Filed: May 30, 2002

(65) Prior Publication Data

US 2003/0222290 A1   Dec. 4, 2003

(51) Int. Cl.[7] .................. H01L 29/76; H01L 29/94; H01L 31/062; H01L 31/113; H01L 31/119
(52) U.S. Cl. .................. 257/329; 257/471; 438/212
(58) Field of Search ................. 257/282, 288, 257/544, 301, 304, 311, 327, 328, 329, 471, 257/481, 475, 476; 438/527, 212, 109, 658

(56) References Cited

U.S. PATENT DOCUMENTS

| | | | | |
|---|---|---|---|---|
| 4,072,975 A | * | 2/1978 | Ishitani | ........................ 257/339 |
| 5,264,716 A | * | 11/1993 | Kenney | ....................... 257/301 |
| 5,818,084 A | | 10/1998 | Williams et al. | |
| 6,186,408 B1 | | 2/2001 | Rodov et al. | |
| 6,346,726 B1 | * | 2/2002 | Herman | ........................ 257/327 |
| 6,420,225 B1 | | 7/2002 | Chang et al. | |
| 6,563,151 B1 | * | 5/2003 | Shin et al. | .................... 257/288 |

FOREIGN PATENT DOCUMENTS

JP          06169089 A  *  6/1994  ......... H01L 29/784

\* cited by examiner

*Primary Examiner*—B. William Baumeister
*Assistant Examiner*—Dana Farahan
(74) *Attorney, Agent, or Firm*—Beyer Weaver & Thomas LLP

(57) ABSTRACT

A power device having vertical current flow through a semiconductor body of one conductivity type from a top electrode to a bottom electrode includes at least one gate electrode overlying a gate insulator on a first surface of the body, a channel region of second conductivity type in the surface of the body underlying all of the gate electrode, a first doped region of the second conductivity type contiguous with the channel region and positioned deeper in the body than the channel region and under a peripheral region of the gate electrode, and a second doped source/drain region in the surface of the body abutting the channel region and adjacent to the gate electrode. When the gate is forward biased, an inversion region extends through the channel region and electrically connects the first electrode and the second electrode with a small $V_f$ near to the area between adjacent P bodies being flooded with electrons and denuded of holes. Therefore, at any forward bias this area conducts as an N-type region. When the gate electrode is reverse biased, the long channel region underlying the full length of the gate electrode reduces reverse leakage current.

14 Claims, 19 Drawing Sheets

POWER DEVICE HAVING REDUCED REVERSE BIAS LEAKAGE CURRENT

CROSS-REFERENCES TO RELATED APPLICATIONS

This patent application is related to U.S. Pat. No. 6,186,408 issued Feb. 13, 2001, and co-pending application Ser. No. 09/544,730 filed Apr. 6, 2000 for Method of Fabricating Power Rectifier Device to Vary Operating Parameters in Resulting Structure; application Ser. No. 09/744,262 filed Dec. 19, 2000, for Multiple Fabricating Power Rectifier Device to Vary Output Parameters in Resulting Structure; application Ser. No. 09/805,815 filed Mar. 13, 2001 for Method of Fabricating Power Rectifier Device; and application Ser. No. 10/037,495 filed Jan. 2, 2002 for Power Device Having Vertical Current Path with Enhanced Pinchoff for Current Limiting, the descriptions of which are incorporated by reference for all purposes.

BACKGROUND OF THE INVENTION

This invention relates generally to power semiconductor devices, and more particularly the invention relates to a power semiconductor rectifier device and a method of making same.

Power semiconductor rectifiers have a variety of applications including use in power supplies and power converters. Heretofore, Schottky diodes have been used in these applications. A Schottky diode is characterized by a low turn on voltage, fast turn off, and nonconductance when the diode is reverse biased. However, to create a Schottky diode a metal-silicon barrier must be formed. In order to obtain proper characteristics for the Schottky diode, the barrier metal is likely different than the metal used in other process tips such as metal ohmic contacts. Further, Schottky diode rectifiers suffer from problems such as high leakage current and reverse power dissipation. Also, these problems increase with temperature thus causing reliability problems for power supply applications. Therefore the design the voltage converters using Schottky barrier diodes can cause design problems for many applications.

A semiconductor power rectifier device is known which does not employ Schottky diodes. FIG. 1 from U.S. Pat. No. 5,818,084 is a schematic of such a device which comprises a MOSFET transistor shown generally at 10 having a source/drain 12 which is shorted to a gate 14. A parasitic diode 16 is connected from the source/drain 12 to the drain/source 18. The patent discloses the use of a trench for accommodating the gate.

U.S. Pat. No. 6,186,408, supra, discloses a vertical semiconductor power rectifier device which employs a large number of parallel connected cells, each cell comprising a MOSFET structure with a gate-drain short via common metallization. This provides a low $V_f$ path through the channel regions of the MOSFET cells to the source region on the other side of the device. The method of manufacturing the rectifier device provides highly repeatable device characteristics and reduced manufacturing costs. The active channel regions of the device are defined using pedestals in a double spacer, double implant self-aligned process. The channel dimensions and doping characteristics may be precisely controlled despite inevitable process variations and spatial sidewall formation.

The co-pending applications identified above disclose improved methods of manufacturing a semiconductor power rectifier device and resulting structure. As shown in the section view of FIG. 2, the semiconductor substrate 20 including epitaxial layer 22 function as one source/drain (e.g., the drain) of the device. A plurality of second source/drains (e.g., source) regions 24 are formed on a major surface of the substrate along with a plurality of gate electrodes 26 and the source/drains 24 and gate electrodes 26 positioned within a guard ring 28, along with, optionally, conductive plugs 30 in the major surface. A conductive layer 32 contacts source/drain regions 24 and gate electrodes 26, and conductive layer 34 contacts substrate 20.

The semiconductor rectifier device is fabricated using conventional semiconductor processing steps including photoresist masking, plasma etching, and ion implantation in forming the guard ring, connective plug, source/drain regions, and gate electrodes overlying device channel regions. In accordance with one feature of the disclosed process, a photoresist mask is used in defining the gate oxide and gate of the device, which is anisotropically or otherwise etched to expose peripheral portions of the gate electrode through which ions are implanted to create channel regions in body regions under and controlled by the gate electrode. FIG. 3 is a plan view of the device showing in the boundary of substrate 20, guard ring 28, optional plugs 30, gate regions 26 and source/drains 24 which are in between gate regions 26, and top electrode 32. The P/N junction 36 between the channel region and the epitaxial layer 22 of the bottom source/drain is defined by shallow uniform boron implant which forms P region 38.

The devices disclosed in the above patent and co-pending patent applications realize a low $V_f$ by having short channel regions under the gate structures. However, the reverse bias leakage current of an MOS diode may increase when $V_f$ is very low due to the nature of short channel MOS transistors.

The present invention is directed to utilizing a longer channel region under the controlled gate in order to limit reverse bias current leakage.

BRIEF SUMMARY OF THE INVENTION

In accordance with the invention, a cell in a power rectifier diode having vertical current flow from one surface of a semiconductor substrate to an opposing surface includes an MOS gate structure having a shorted drain/source region and gate electrode with the entire region underlying the gate electrode being lightly doped to form a P-N junction with a drain/source region when the gate is reversed biased. The lightly doped region is shallow whereby a long channel region is readily formed when the gate is forward biased, with the channel region extending deeper into the semiconductor substrate than the depth of the lightly doped region under the gate electrode. Thus, a forward current can flow from the top electrode to the bottom electrode through the inverted N-channel region. However, a reverse bias voltage causes the long channel inversion region to revert to the lightly doped region which enhances blockage of reverse bias leakage current.

The invention and objects and features thereof will be more readily apparent from the following detailed description and appended claims when taken with the drawings.

DETAILED DESCRIPTION OF THE INVENTION

FIGS. 4–16B are section views illustrating steps in fabricating a power rectifier in accordance with the invention. The steps in FIGS. 4–13 are similar to the steps in fabricating the power rectifier devices described in the co-pending patent applications, supra, and FIGS. 14A–16B illustrate specific steps in fabricating embodiments of the present invention.

Figure 1:
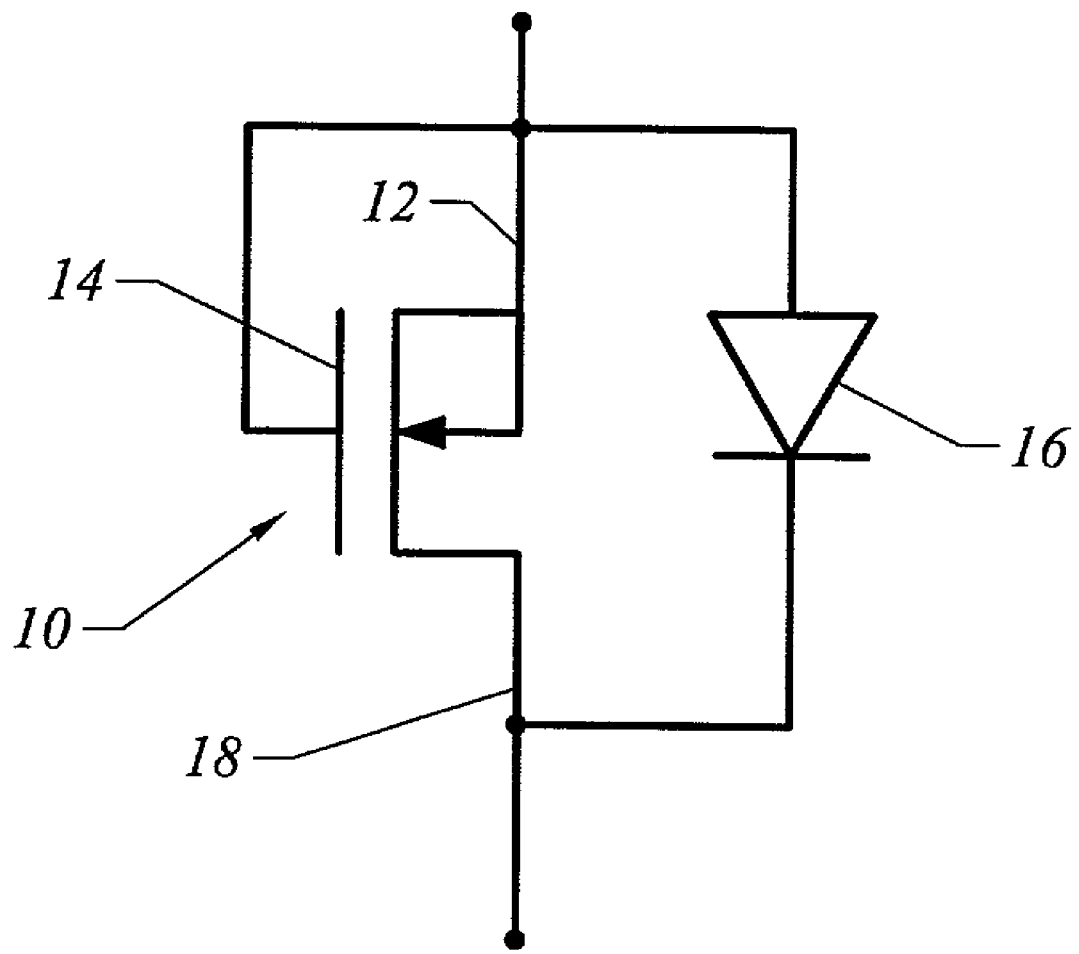
FIG. 1 is an electrical schematic of a power rectifier device to which the invention applies.
Figure 2:
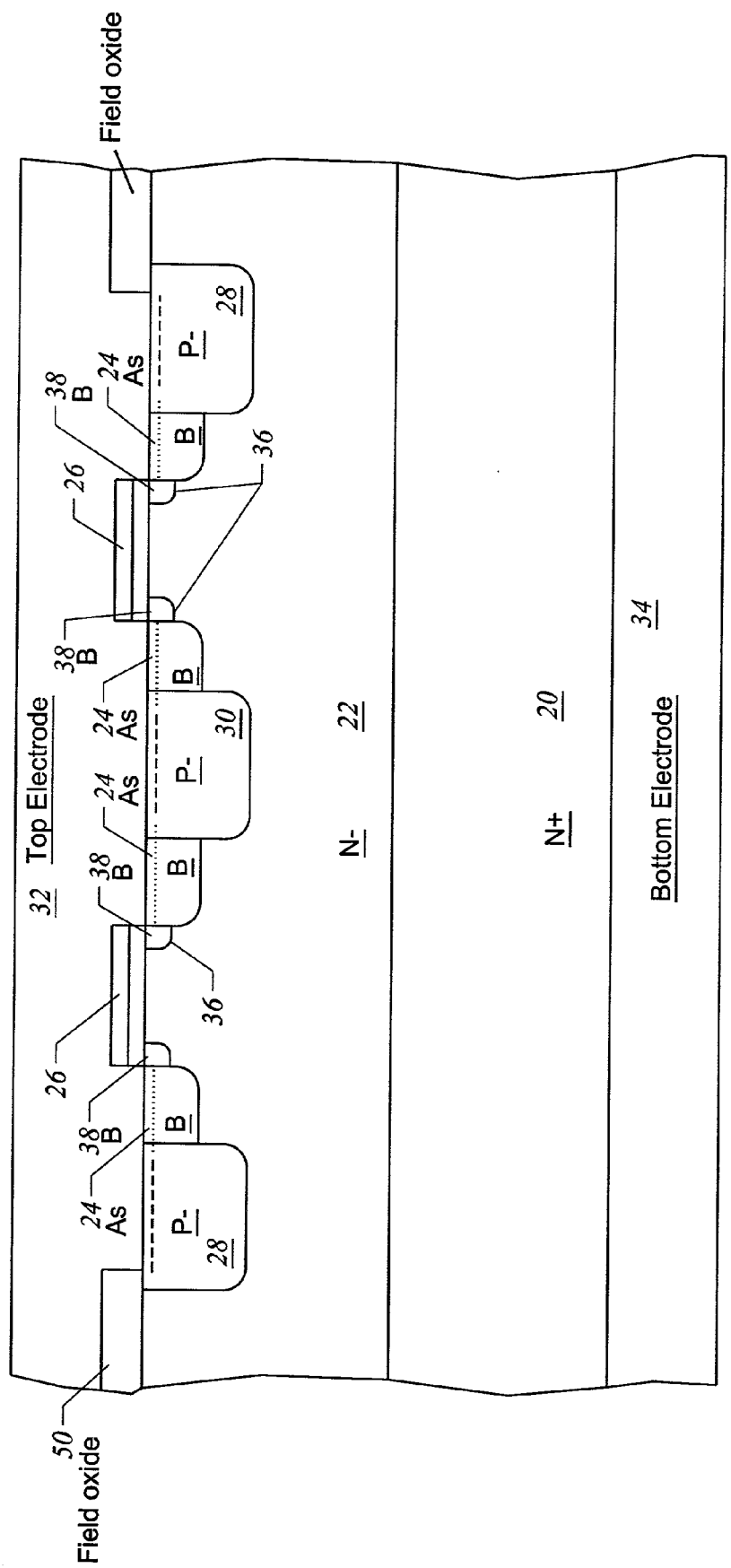
FIG. 2 is a section view of a power rectifier device in accordance with a co-pending patent application.
Figure 3:
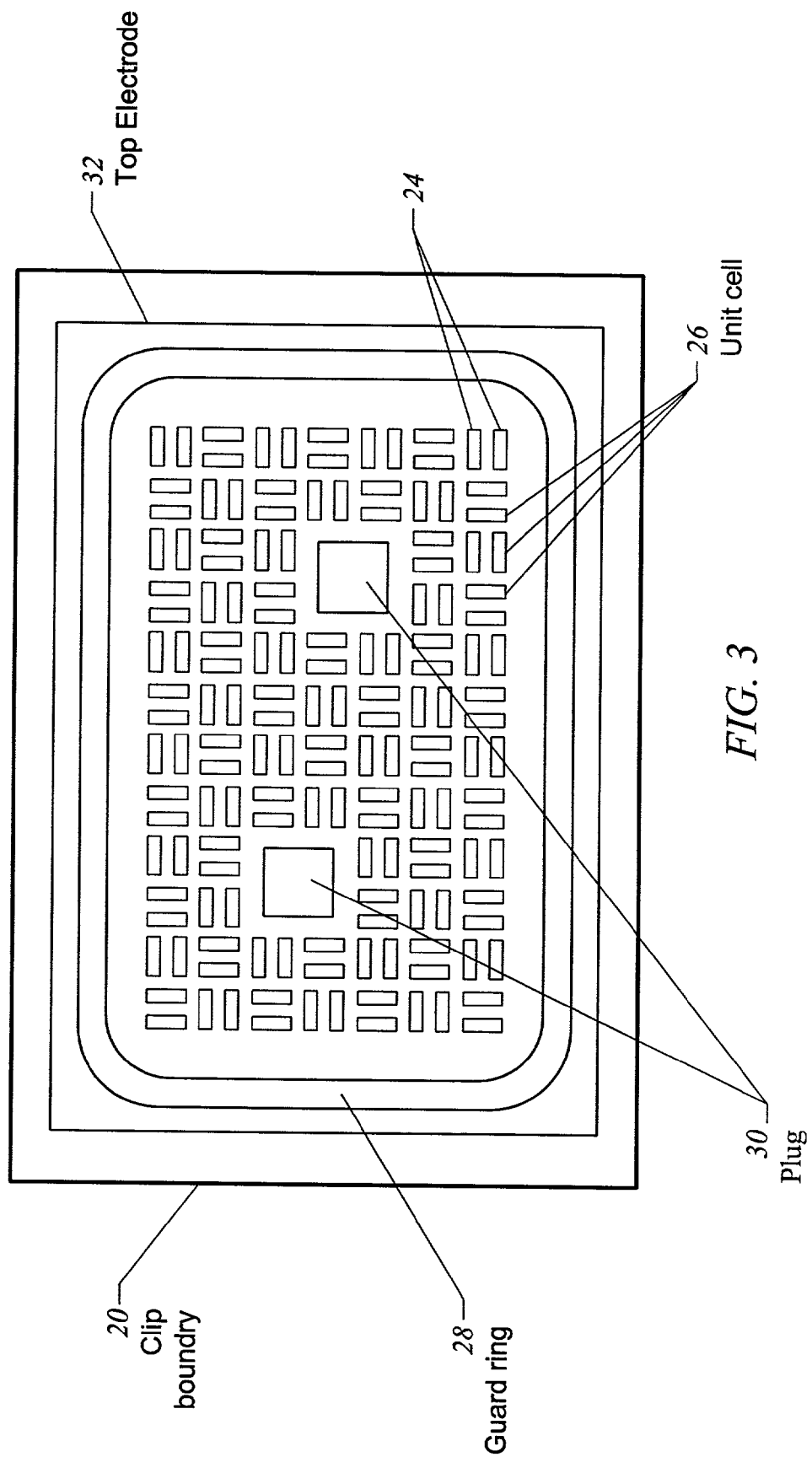
FIG. 3 is a plan view of the power rectifier device of FIG. 2.
Figure 4:
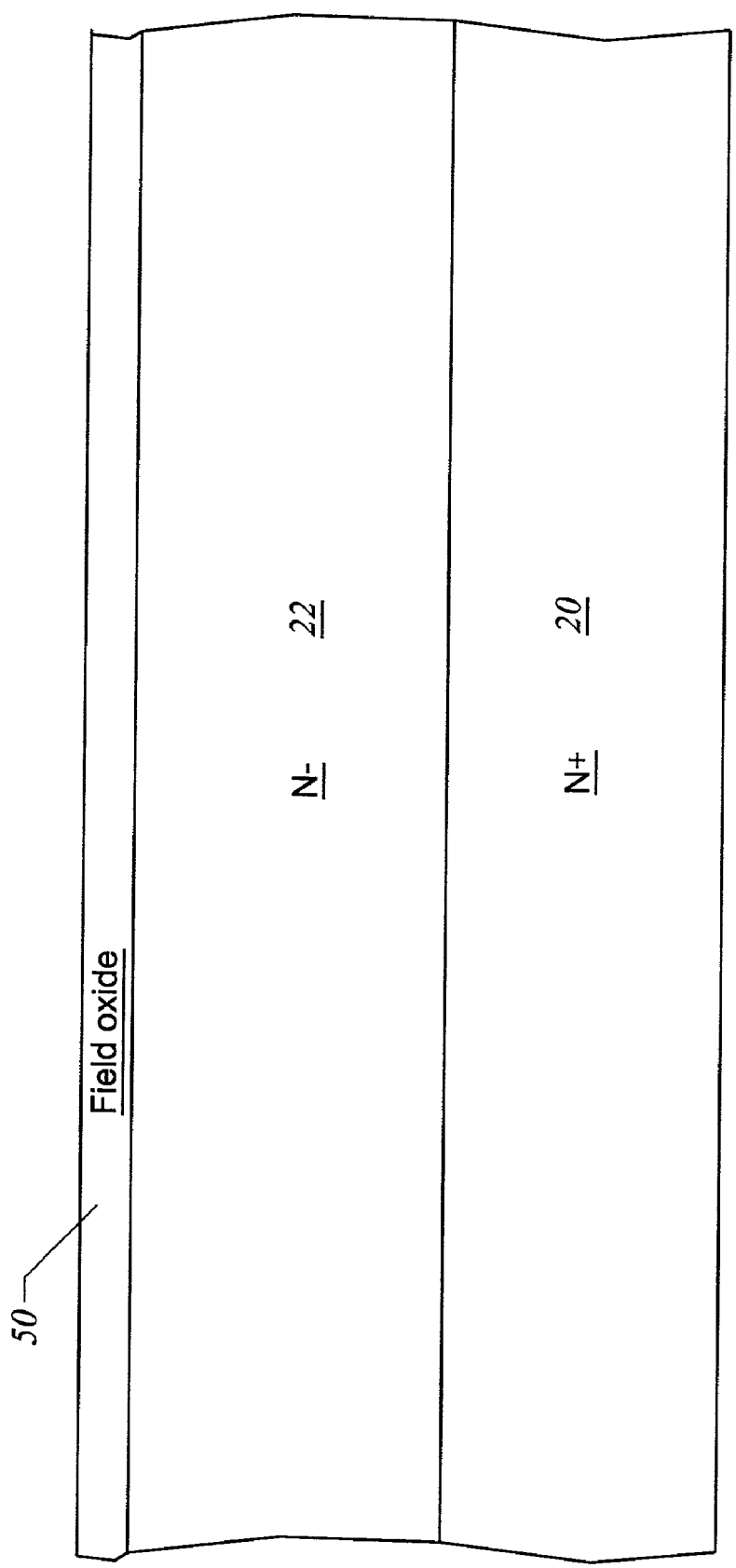
FIGS. 4–16B are section views illustrating steps in fabricating a power rectifier device in accordance with the invention.
Figure 5:
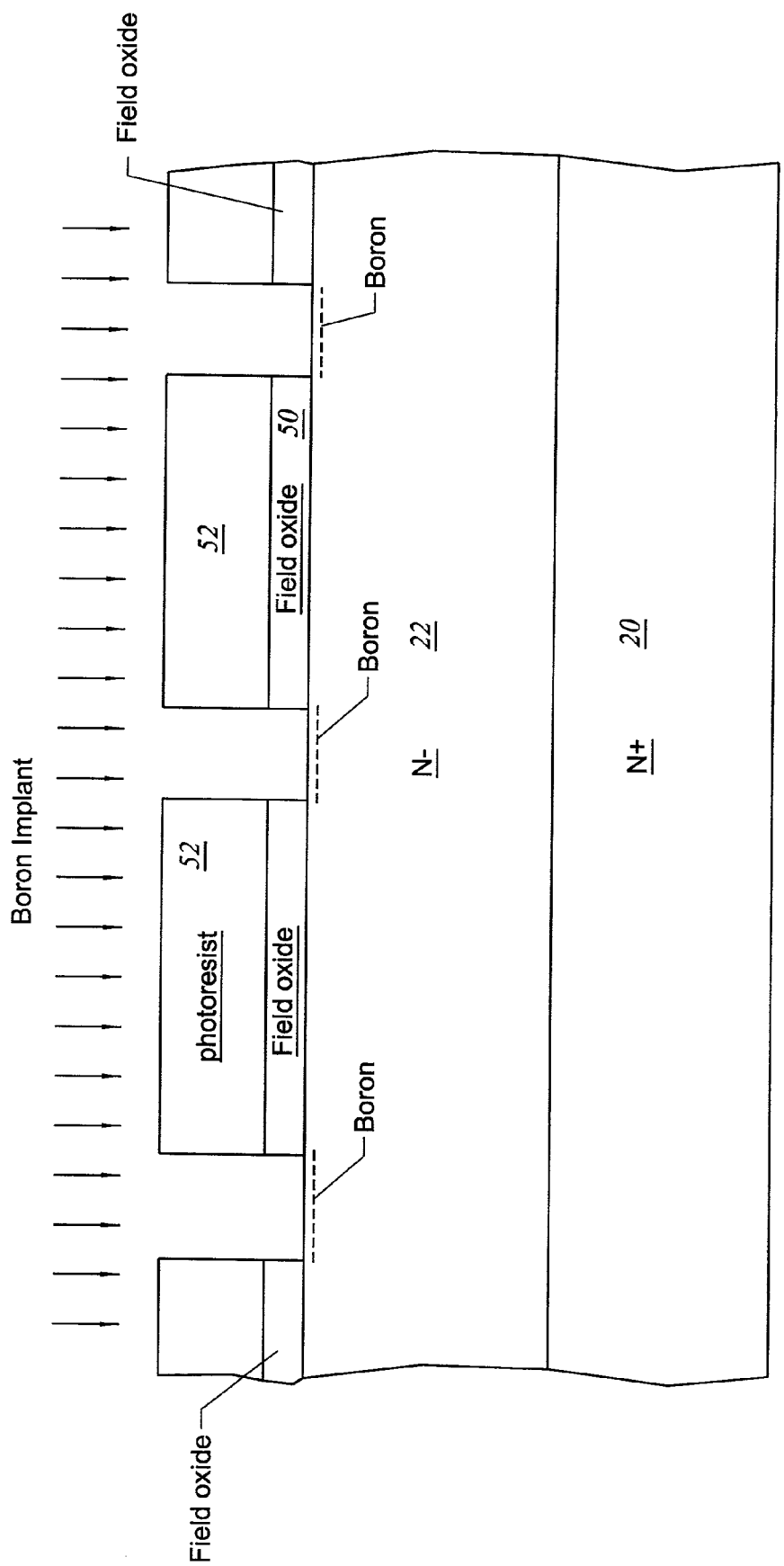
Figure 6:
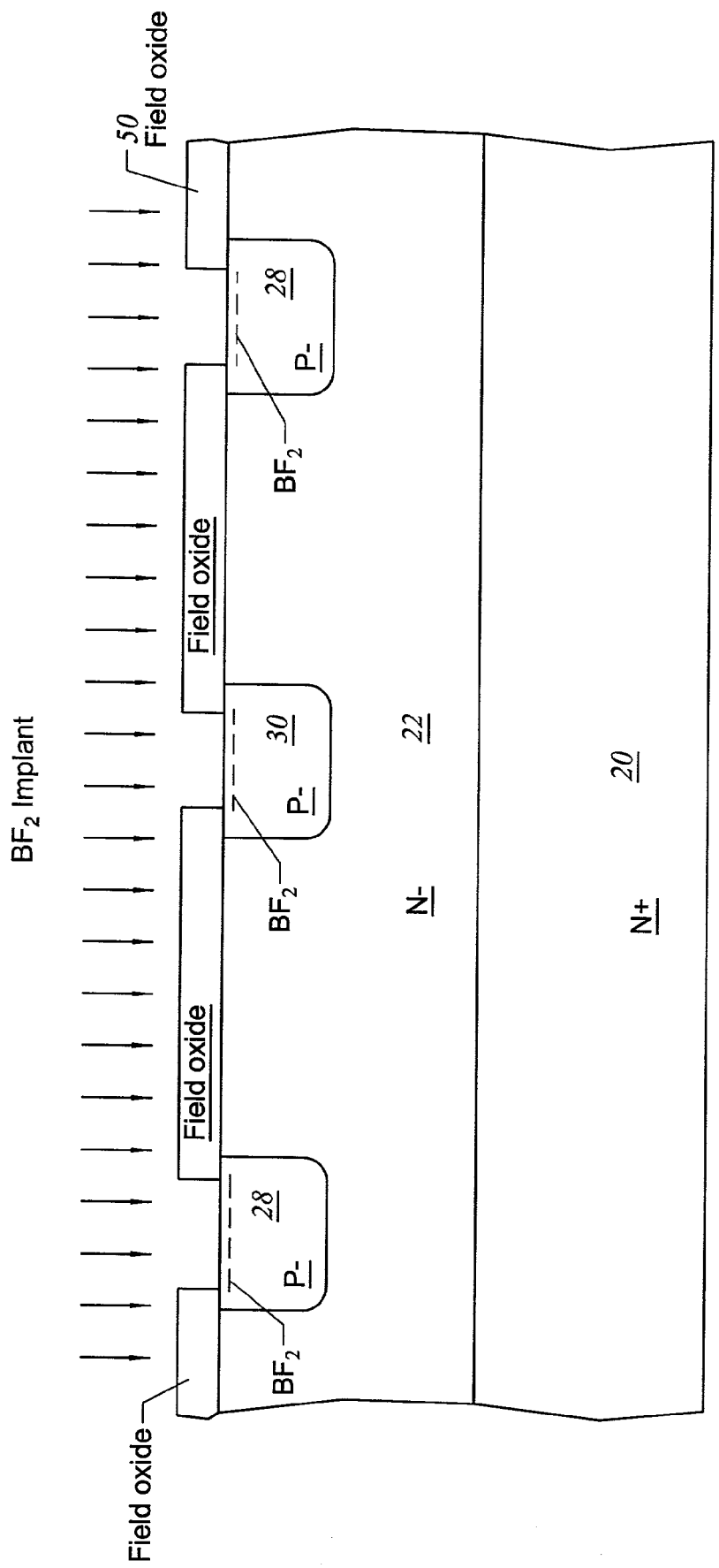

Referring to FIG. 4, a semiconductor body includes N+ substrate 20 on which is formed N– epitaxial layer 22 having a resistivity on the order of 0.1–10 ohm cm. Field oxide 50 is grown or deposited on the surface of layer 22 to a thickness of 300–1000 nm. Thereafter, as shown in FIG. 5, a photoresist pattern 52 is selectively formed over field oxide 50 by photoresist masking and etching techniques, and a P-type dopant such as boron is then implanted through openings in the photoresist. The boron can be implanted before or after photoresist removal, and as shown in FIG. 6, a boron thermal drive in forms deep P-regions including an angular guard ring 28 which defines a device region in layer 22 and, optionally, one or more P-doped conductive plugs 30 within the device region. Plugs 30 are not essential in the device, especially for small area rectifier devices in which the guard ring would suffice in forming a diode with layer 22. Dopant concentration of the P-doped regions is on the order of E11–E14 $cm^2$. A second $BF_2$ or In implant (dose of E12–E15/$cm^2$) is then made in the surface of the P-doped regions for high surface concentration to form good ohmic contacts, and then the $BF_2$ or In is activated by rapid thermal annealing.

Figure 7:
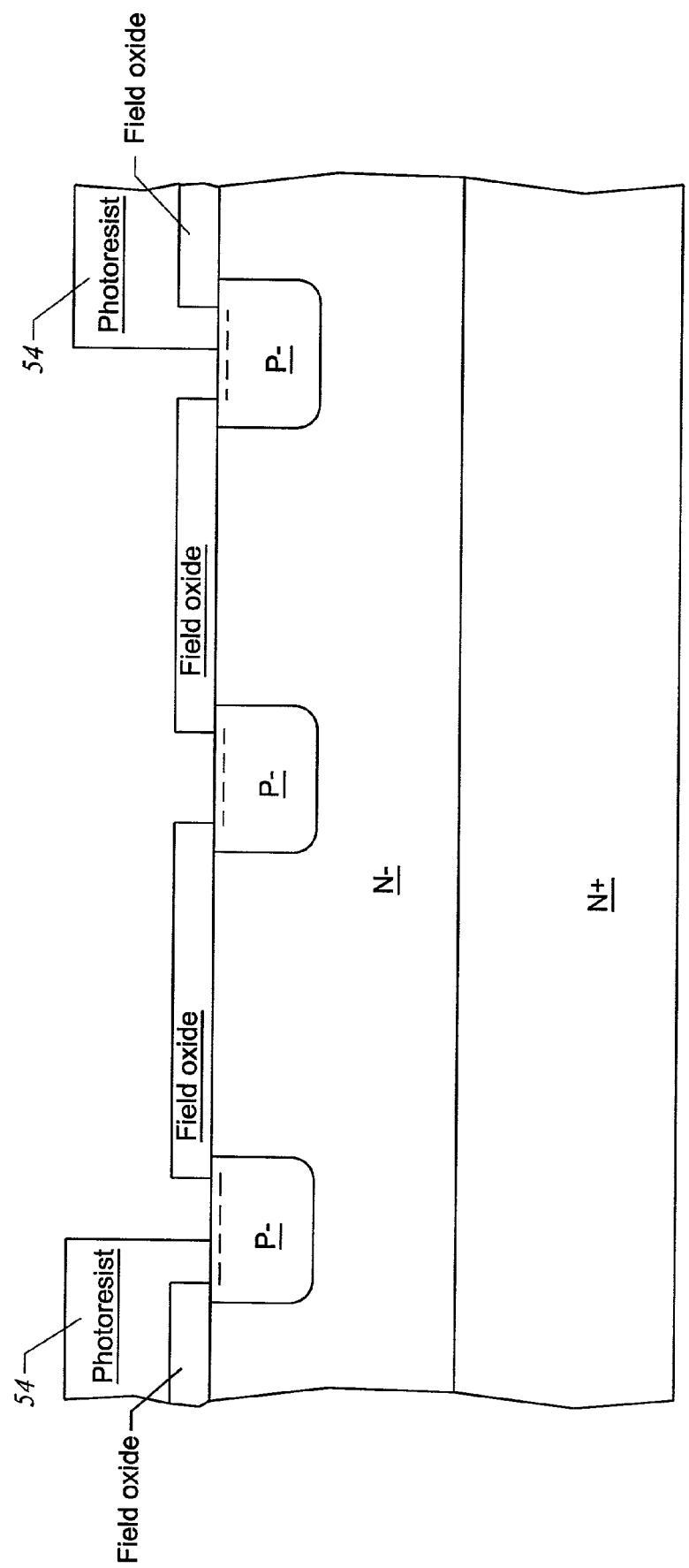
Figure 8:
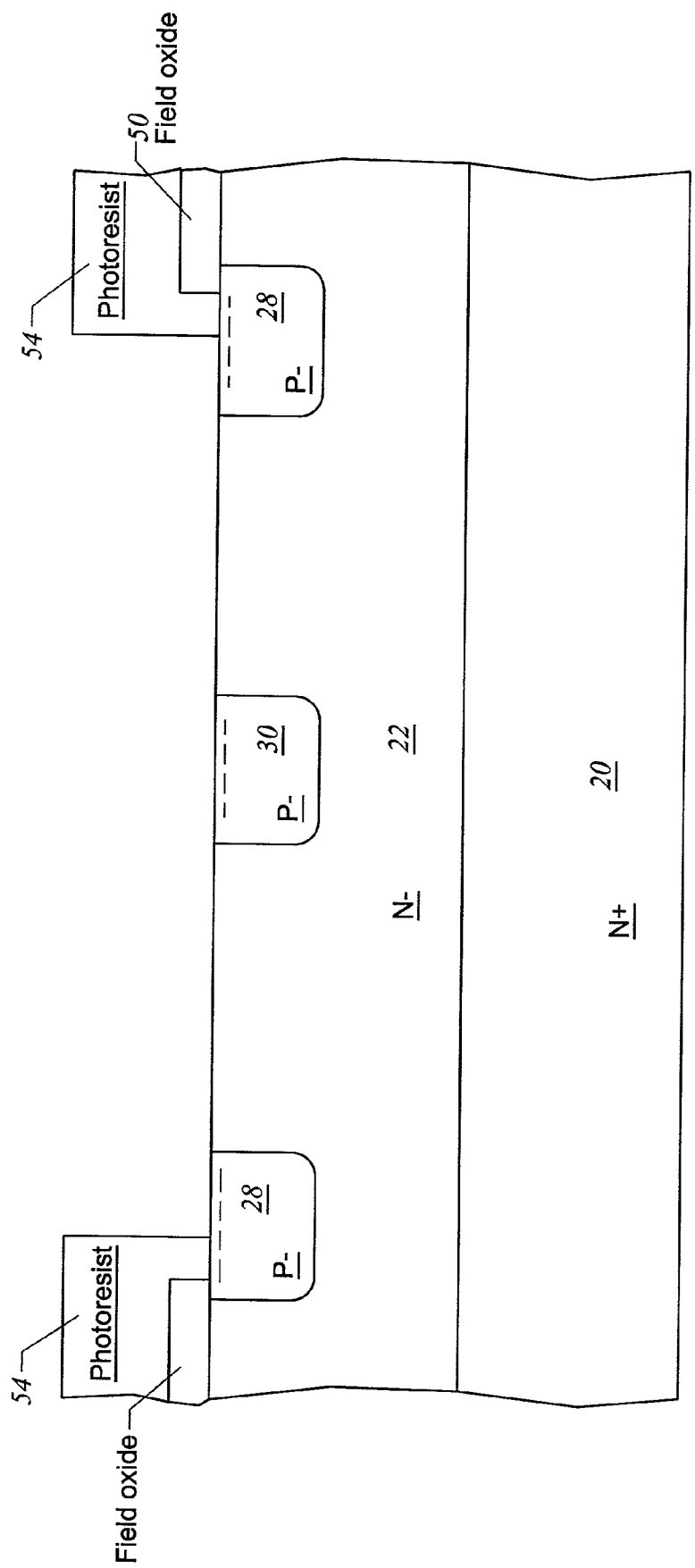
Figure 9:
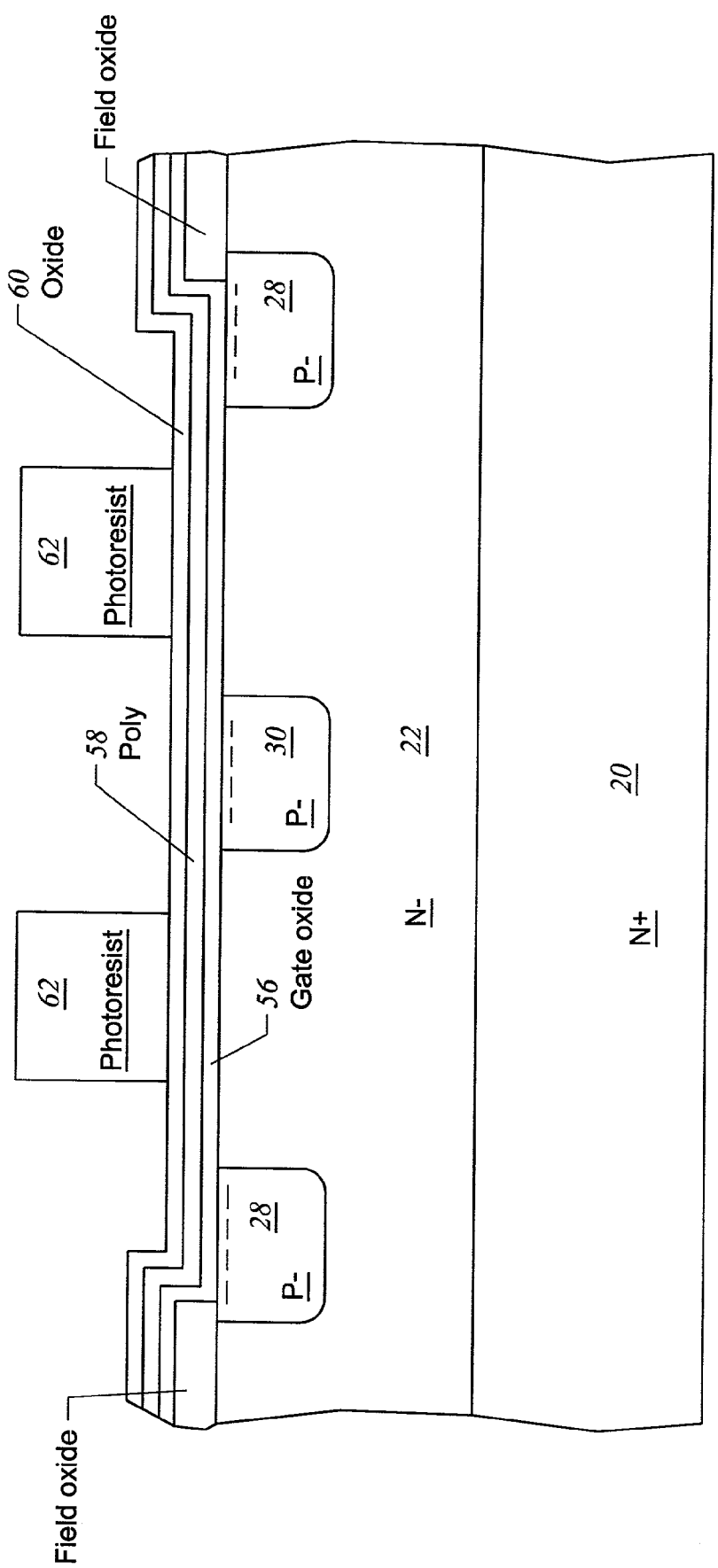

Next as shown in– FIG. 7, a photoresist pattern 54 is developed to cover the area outside of the device region, and then the field oxide 50 in the device region is removed by etching as shown in FIG. 8. Thereafter, as shown in FIG. 9, photoresist 54 is removed, and a 5–50 nm gate oxide 56 is grown followed by the deposition of 10–100 nm in-situ doped polysilicon 58 or undoped polysilicon with a subsequent implant. The polysilicon layer is optional and if a metal gate or transistor structure is acceptable, it is not necessary to deposit the polysilicon layer. Thereafter, a 5–200 nm insulator such as silicon oxide or silicon nitride 60 is formed over polysilicon 58, and then a photoresist pattern 62 is formed to define MOS transistor units.

Figure 10:
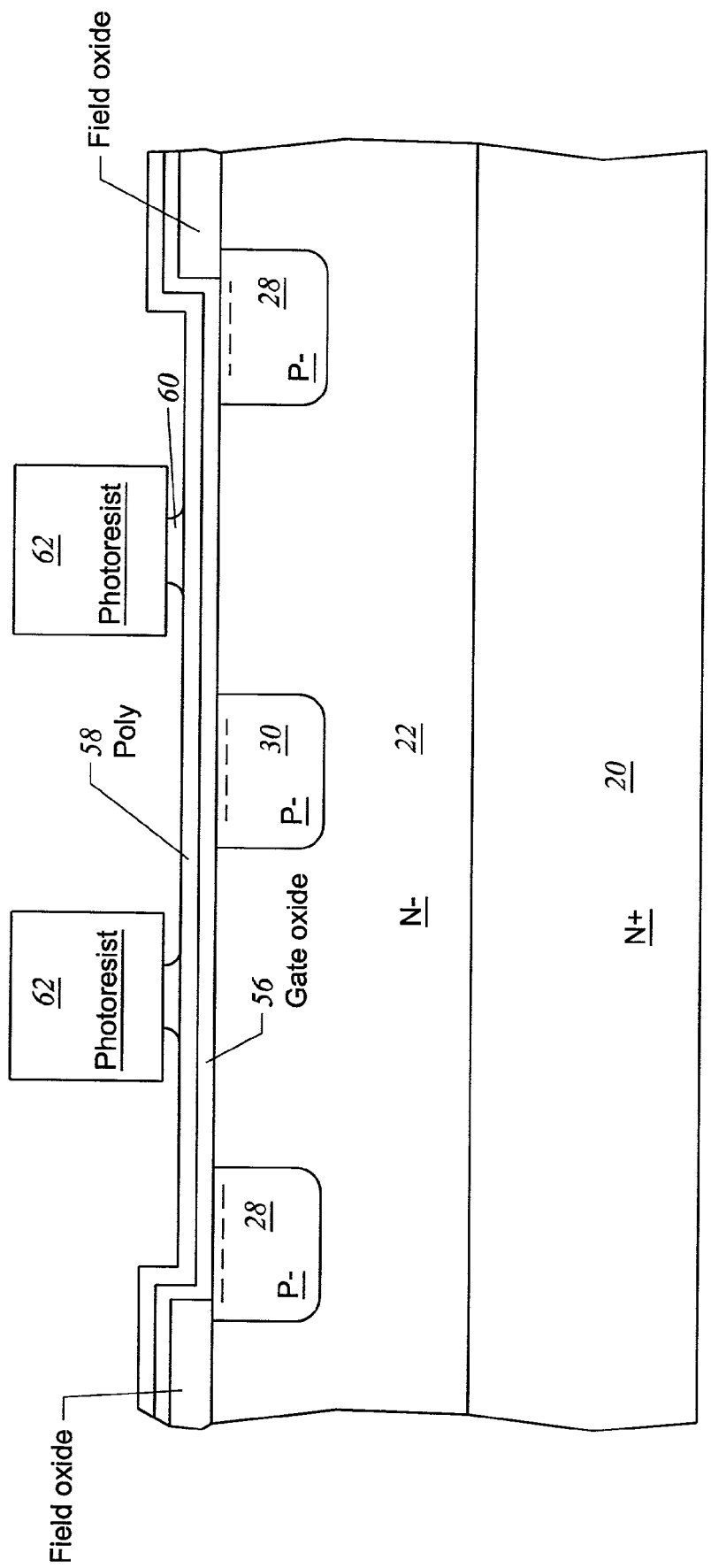
Figure 11:
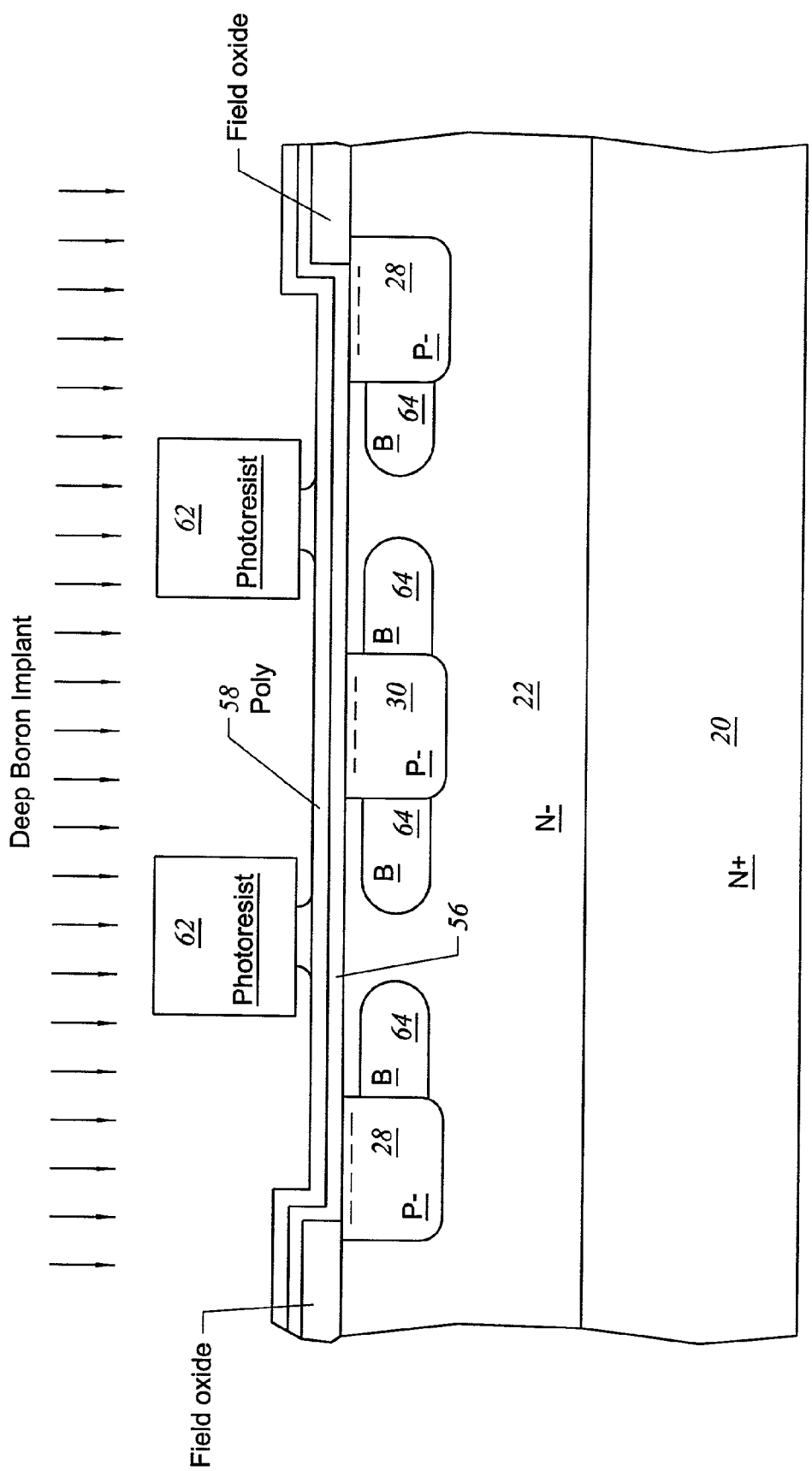
Figure 12:
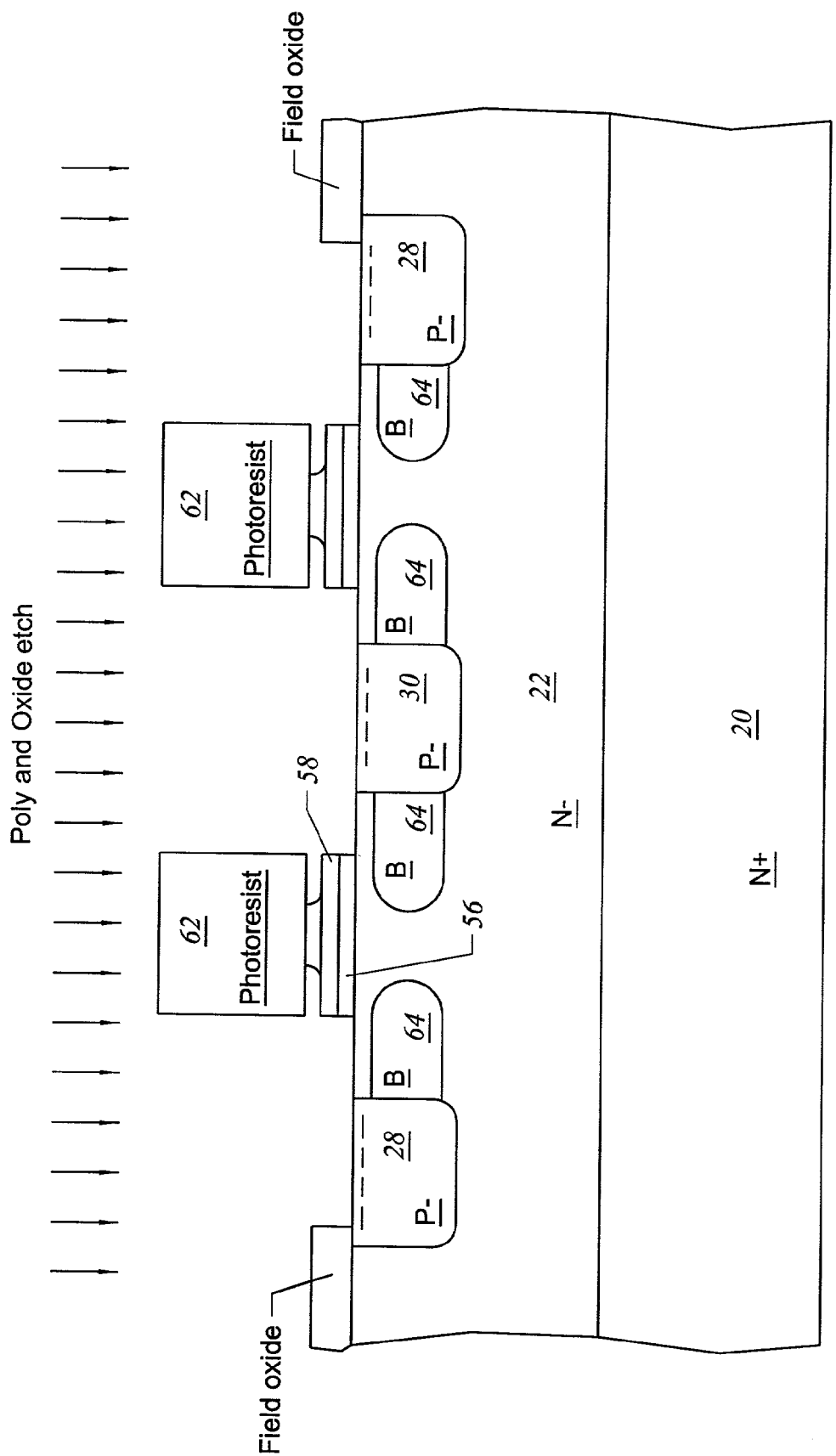

Thereafter, as shown in FIG. 10, an isotropic wet oxide etch is applied to remove the exposed silicon oxide 60 and undercut the remaining silicon oxide under photoresist patterns 62. A deep boron implant is then performed as illustrated in FIG. 11, forming boron doped regions 64 extending from the guard ring 28 and plug 30. The boron implant energy must be high enough to cause some lateral scattering, or alternatively the implant can be executed at an angle whereby the implanted region extends under photoresist 62. This implant can be performed after removal of the exposed polysilicon 58 and silicon oxide 56 by anisotropic plasma etching as shown in FIG. 12. Rapid thermal annealing can be employed to activate the boron in doped regions 64.

Figure 13:
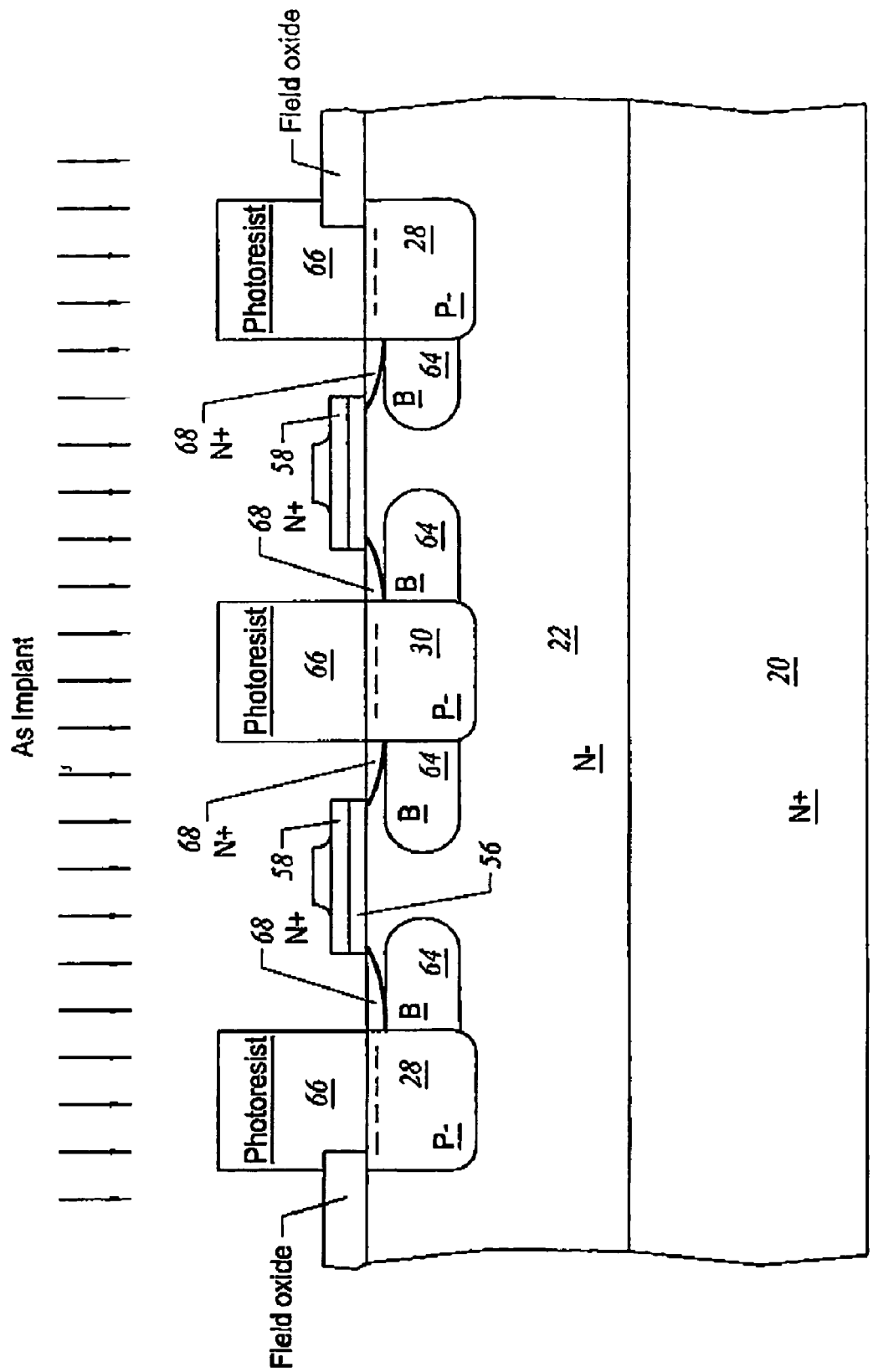

In FIG. 13 guard ring 28 and plug 30 are covered with photoresist 66 and then arsenic or phosphorus is implanted to form N+ source/drain regions 68 which are self aligned with the polysilicon gate structures 58 and abut the boron-doped P regions 64.

Figure 14A:
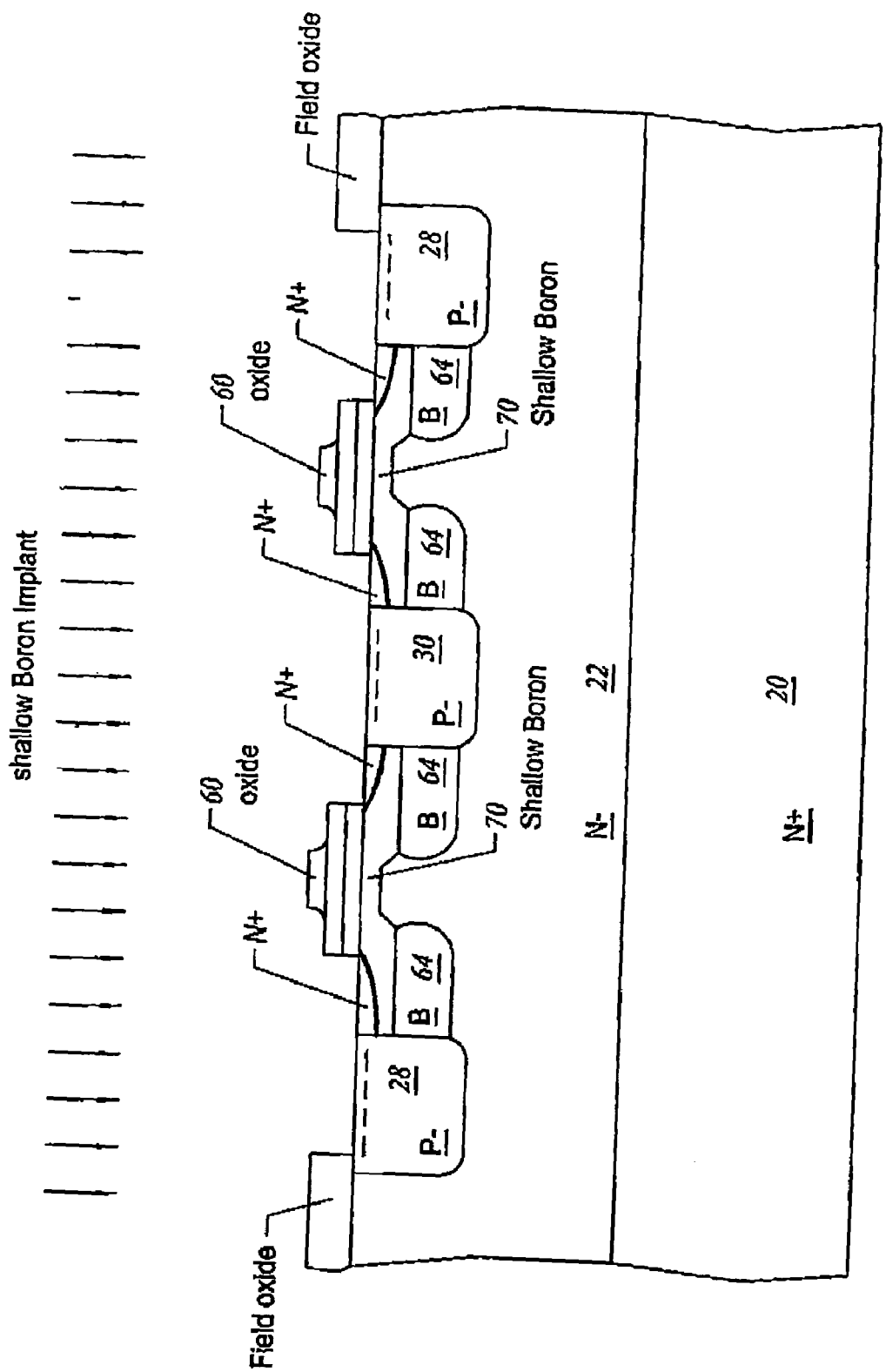
Figure 14B:
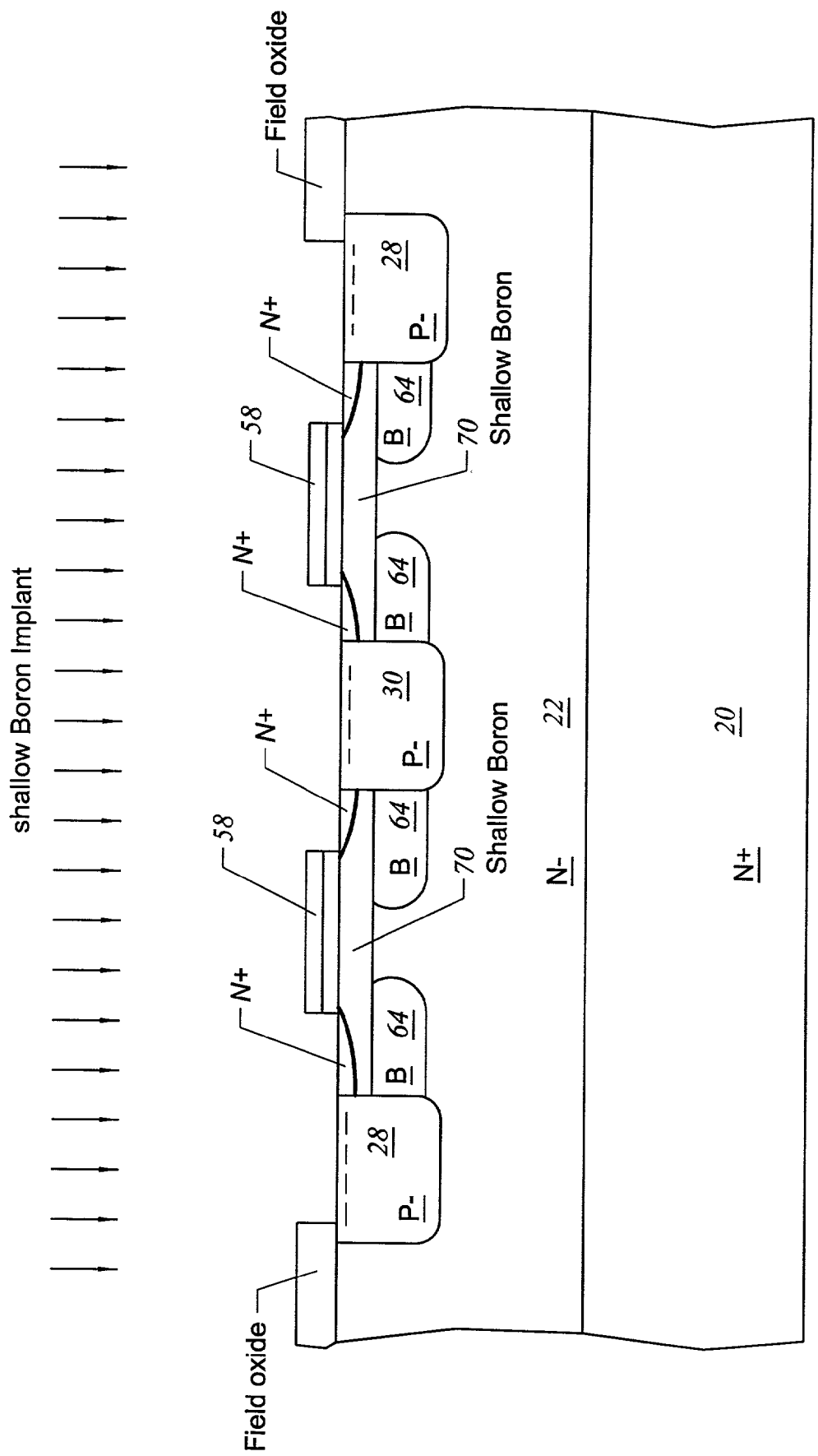

In accordance with the invention, the process now includes forming shallow lightly doped P regions 70 under the gate structures 58 by shallow boron implant at an energy of 10–80 KeV and an implant dose of 1E11–1E14 atoms/$cm^2$. This step differs from the prior art in which the polysilicon gates were covered by photoresist to prohibit the implantation of boron ions through the gate structure and into the underlying substrate. FIG. 14B illustrates an embodiment in which the top oxide layer 60 is not used and the shallow boron implant followed by rapid thermal annealing forms the shallow boron region 70 under the gate structure. The shallow boron implant forms the region 70 with a thickness less than the inversion layer thickness of the final product when forward biased, as will be described further hereinbelow.

Figure 15A:
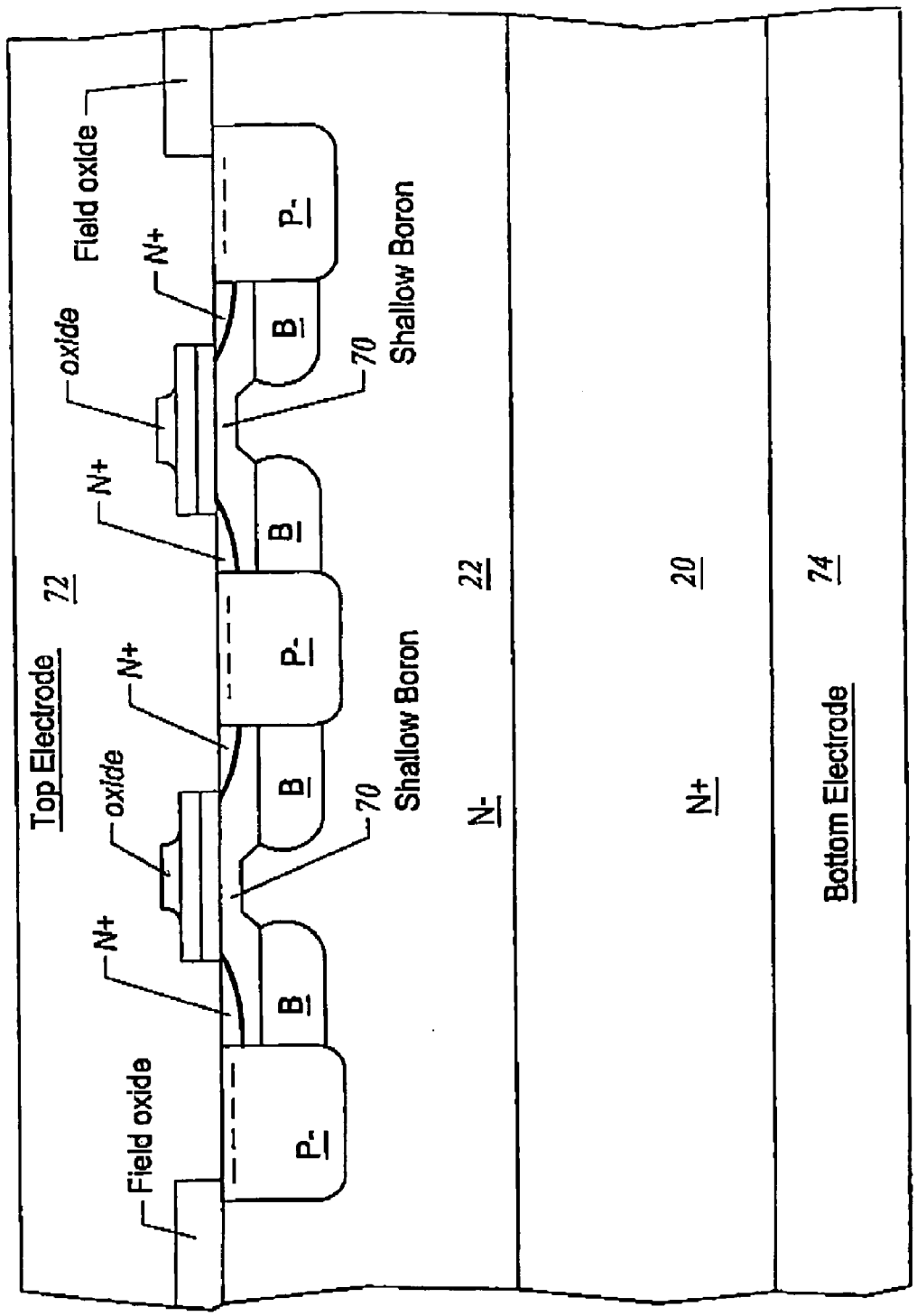
Figure 15B:
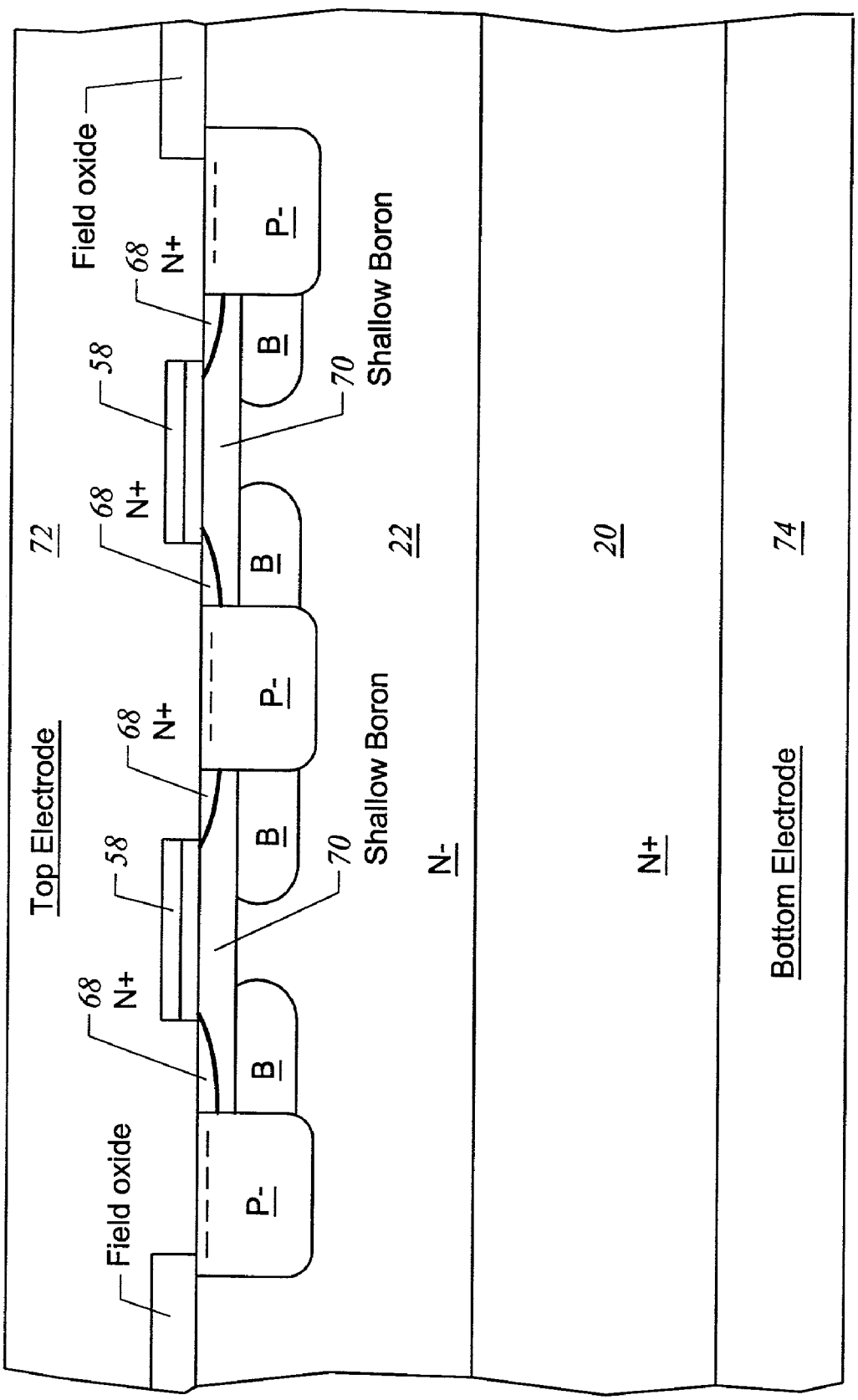

Finally, as shown in FIGS. 15A, 15B, a top electrode 72 and bottom electrode 74 are formed using materials such as Ti, TiN, Ni, Ag, Au, Cu, and Al, for example, or combinations of two or more such metals. Rapid thermal annealing can be employed to form good ohmic contacts, if necessary.

Figure 16A:
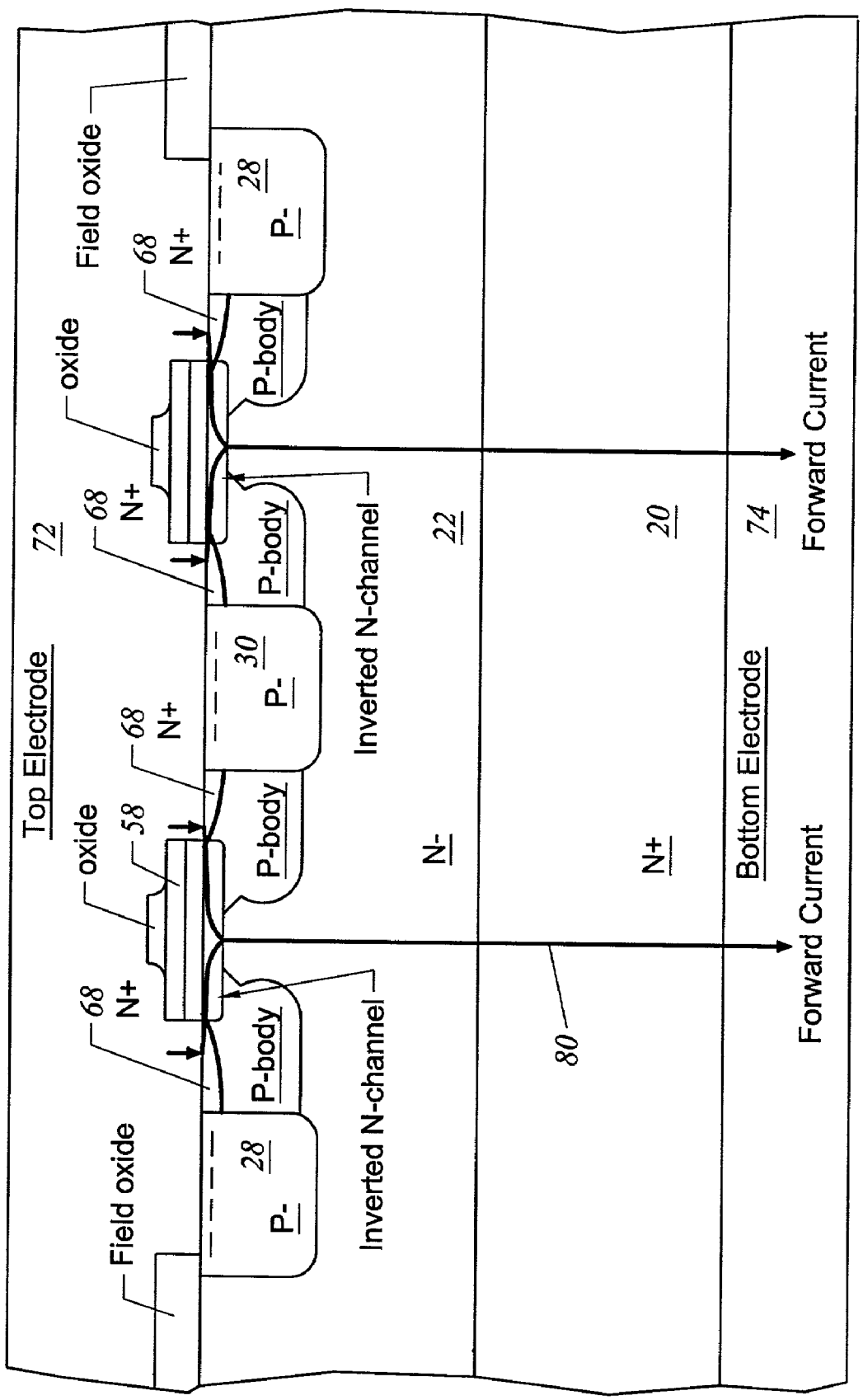
Figure 16B:
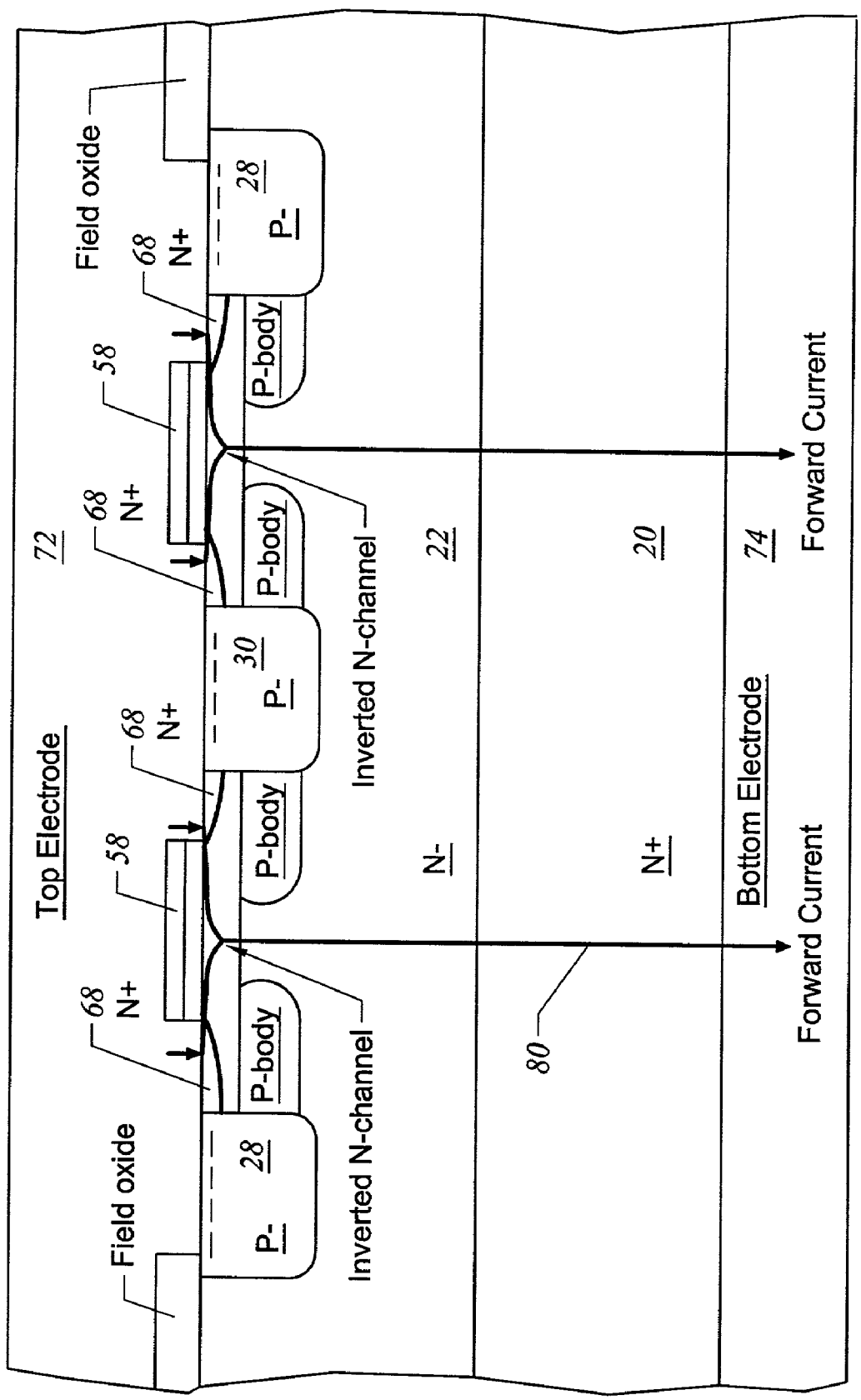

In accordance with the invention, the resulting structure when forward biased as illustrated in FIGS. 16A, 16B creates an inverted N-channel region extending through the shallow boron layer 70 whereby current flows as shown at 80 from source/drain regions 68 through the channel region under gate 58 and through epitaxial layer 22 and substrate 20 to the bottom electrode 74.

The depth of the shallow implant which forms the P region 70 under the gate electrode must be less than the depth of the inverted channel region when the gate is forward biased. Further, the gate potential even with zero bias causes the area between adjacent P bodies to be flooded with electrons and denudes the area of holes. Therefore, at any forward bias this area conducts as an N-type region would conduct, and this inverted N-type region forms a channel for forward current to flow from the top electrode to the bottom electrode through N+ source/drain region 68, inverted N-channel region, N-layer region 22, and N+ substrate 20, as shown in FIGS. 16A and 16B. Of course, in case the inverted channel depth is shallower than that of the boron implant region 70, a barrier would exist between the channel region and the N-region 22. This barrier would retard the forward current flow, resulting in a high $V_f$. Thus the fabrication process must be well controlled so that no barrier is formed.

In one embodiment N+ substrate 20 has a dopant concentration of 1E18–1E21 atoms/$cm^3$ atoms/cc, N– epitaxial layer has a dopant concentration of 1E13–1E17 atoms/$cm^3$, the deep P doped regions have a dopant concentration of 1E14–1E19 atoms/$cm^3$, the source/drain regions in the surface of the epitaxial layer have a dopant concentration of 1E18–1E21 atoms/$cm^3$, and the implanted P regions under the gate electrodes have a dopant concentration of 1E14–1E19 atoms/$cm^3$.

The vertical power rectifier device in accordance with the invention emulates a Schottky diode with the forward bias inversion region extending through the lightly doped shallow P region when the gate electrode is forward biased. However, the long channel region reduces reverse bias leakage current. While the invention has been described with reference to specific embodiments, the description is illustrative of the invention and is not to be construed as limiting the invention. For example, the dopant types can be reversed. Thus, various modifications and applications may occur to those skilled in the art without departing from the true spirit and scope of the invention as defined by the appended claims.

What is claimed is:

1. A semiconductor power diode comprising:
   a) a semiconductor body of one conductivity type,
   b) at least one gate electrode overlying a gate insulator on a first surface of the body,
   c) a channel region having dopant of a second conductivity type in the first surface of the body underlying all of the gate electrode,
   d) a first doped region of the second conductivity type contiguous with the channel region, and positioned deeper in the body than the channel region and under a peripheral region of the gate electrode,
   e) a second doped region with dopant of the first conductivity type in the first surface of the body abutting the channel region and adjacent to the gate electrode,
   f) a first electrode on the first surface in ohmic contact with the second doped region and the gate electrode, and
   g) a second electrode on a second surface of the body opposite from the first surface,
   whereby an inversion region extends through the channel region and electrically connects the first electrode and the second electrode through the second doped region, the inversion region, and the body when the gate electrode is forward biased, the channel region underlaying all of the gate electrode providing reduced reverse bias leakage current between the first electrode and the second electrode, an the first doped region defines a vertical current path from the inversion region into the semiconductor body under the gate electrode between the first electrode and the second electrode.

2. The diode of claim 1 wherein the length of the channel region blocks leakage current when the gate electrode is reverse biased.

3. The diode as defined by claim 2 wherein the semiconductor body comprises an N+ doped substrate and an N− doped epitaxial layer, the epitaxial layer providing the first surface of the semiconductor body.

4. The diode as defined by claim 3 wherein the N+ substrate has a dopant concentration on the order of 1E18–1E21 atoms/cm$^3$, the N− epitaxial layer has a dopant concentration on the order of 1E13–1E17 atoms/cm$^3$, the first doped region has a dopant concentration on the order of 1E14–1E19 atoms/cm$^3$, the second doped region has a dopant concentration on the order of 1E14–1E19 atoms/cm$^3$, and the channel region has a dopant concentration on the order of 1E14–1E19 atoms/cm$^3$.

5. The diode as defined by claim 4, and further including at least one doped plug of the second conductivity type in the epitaxial layer, the first electrode ohmically contacting the doped plug.

6. The diode as defined by claim 5 wherein the first electrode and the second electrode comprise a metal selected from the group consisting of Ti, W, Ni, Ag, Cu, Al and a combination of at least two materials of the group.

7. The diode as defined by claim 6, and further including a plurality of gate electrodes, channel regions, first doped regions, and second doped regions all within a guard ring.

8. A method of fabricating a semiconductor diode in a semiconductor body having current flow vertically from one major surface to another major surface comprising the steps of:
   a) providing a semiconductor body of one conductivity type,
   b) forming at least one gate electrode on a gate insulator on one surface of the body,
   c) forming a doped channel region of a second conductivity type in the first surface of the substrate underlying all of the gate electrode,
   d) forming a first doped region of the second conductivity type within the body contiguous with the channel region and deeper in the substrate than the channel region and under a peripheral region of the gate electrode,
   e) forming a second doped region of the first conductivity type in the first surface on the body and abutting the channel region and adjacent to the gate electrode,
   f) forming a first electrode on the first surface in ohmic contact with the second doped region and the gate electrode, and
   g) forming a second electrode on a second surface of the substrate opposite from the first surface,
   whereby an inversion region extends through the channel region and electrically connects the first electrode and the second electrode through the second doped region, the inversion region, and the body when the gate electrode is forward biased leakage current between the first electrode and the second electrode, and the first doped regions defines a vertical current path from the inversion region into the semiconductor body under the gate electrode between the first electrode and the second electrode.

9. The method as defined by claim 8 wherein step a) includes providing a body comprising an N+ doped substrate and an N− epitaxial layer, the epitaxial layer providing the first surface of the body.

10. The method as defined by claim 9 wherein the N+ substrate has a dopant concentration on the order of 1E18–1E21 atoms/cm$^3$, the N− epitaxial layer has a dopant concentration on the order of 1E13–1E17 atoms/cm$^3$, the first doped region has a dopant concentration on the order of 1E14–1E19 atoms/cm$^3$, the second doped region has a dopant concentration on the order of 1E14–1E19 atoms/cm$^3$, and the channel region has a dopant concentration on the order of 1E14–1E19 atoms/cm$^3$.

11. The method as defined by claim 10 and further including the step of:
   h) forming a doped guard ring of the second conductivity type in the first surface which surrounds the gate electrode, the first electrode ohmically contacting the doped guard ring.

12. The method as defined by claim 11 and further including the step of:
   i) forming at least one doped plug of the second conductivity type in the epitaxial layer, before its electrode ohmically contacting the doped plug.

13. The method as defined by claim 12 wherein the first electrode and the second electrode comprise a metal comprise a metal selected from the group consisting of Ti, W, Ni, Ag, Cu, and Al, and a combination of at least two materials of the group.

14. The method as defined by claim 13 wherein step b) includes forming a plurality of gate electrodes, channel regions, first doped regions, and second doped regions all within the guard ring.

* * * * *